United States Patent
Luo

(10) Patent No.: US 11,196,026 B2
(45) Date of Patent: Dec. 7, 2021

(54) ENCAPSULATION STRUCTURE, PRODUCTION METHOD THEREOF, GLUE-SPREADING DEVICE, AND ENCAPSULATION GLUE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 242 days.

(21) Appl. No.: 15/989,144

(22) Filed: May 24, 2018

(65) Prior Publication Data

US 2019/0123302 A1  Apr. 25, 2019

(30) Foreign Application Priority Data

Oct. 20, 2017  (CN) .......................... 201710983868.1

(51) Int. Cl.
*H01L 51/52* (2006.01)
*H01L 51/56* (2006.01)
(Continued)

(52) U.S. Cl.
CPC .......... *H01L 51/5259* (2013.01); *B32B 27/20* (2013.01); *B32B 27/308* (2013.01);
(Continued)

(58) Field of Classification Search
CPC ..... B29C 48/022; B29C 48/21; B29C 48/475; B29C 48/16; B29C 48/06; B29K 2509/00;
(Continued)

(56) References Cited

U.S. PATENT DOCUMENTS

2003/0175512 A1* 9/2003 Ishiguro .................... C09J 7/22
   428/355 AC
2006/0132034 A1* 6/2006 Cho ..................... H01L 51/5259
   313/512
(Continued)

FOREIGN PATENT DOCUMENTS

CN  1491097 A  4/2004
CN  1536936 A  10/2004
(Continued)

OTHER PUBLICATIONS

Masterbond, Understanding Viscosity for Epoxy Adhesives, Potting Compounds and Sealants, Accessed Jul. 9, 2020 <https://www.masterbond.com/techtips/understanding-viscosity-epoxy-adhesives-potting-compounds-and-sealants> (Year: 2020).*

(Continued)

*Primary Examiner* — Cheng Yuan Huang
(74) *Attorney, Agent, or Firm* — Kinney & Lange, P.A.

(57) ABSTRACT

Provided are an encapsulation structure, a production method thereof, a glue-spreading device, and an encapsulation glue. The encapsulation structure has an encapsulation glue layer, wherein the encapsulation glue layer has an adhesive layer formed from an adhesive glue and a desiccant composition core formed from a colloidal desiccant composition, wherein the adhesive layer fully envelops the desiccant composition core, wherein the colloidal desiccant composition has a colloidal desiccant-dispersing medium and a desiccant dispersed in the colloidal desiccant-dispersing medium.

10 Claims, 5 Drawing Sheets

(51) Int. Cl.
*B32B 27/20* (2006.01)
*B32B 27/30* (2006.01)
*C09J 11/04* (2006.01)
*C09J 133/02* (2006.01)
*C08K 3/22* (2006.01)
*C08K 3/08* (2006.01)
*C09J 133/04* (2006.01)

(52) U.S. Cl.
CPC .............. *C09J 11/04* (2013.01); *C09J 133/02* (2013.01); *H01L 51/5246* (2013.01); *B32B 2264/102* (2013.01); *B32B 2307/728* (2013.01); *B32B 2457/206* (2013.01); *C08K 3/08* (2013.01); *C08K 2003/222* (2013.01); *C08K 2003/2206* (2013.01); *C09J 133/04* (2013.01); *H01L 2251/301* (2013.01); *H01L 2251/5369* (2013.01); *Y10T 428/25* (2015.01)

(58) Field of Classification Search
CPC .... B29K 2105/0097; B29K 2995/0092; B29K 2033/04; B32B 27/308; B32B 27/20; B32B 2457/206; B32B 2307/728; B32B 2264/102; C09J 133/02; C09J 11/04; C09J 133/04; C08K 2003/2206; C08K 3/08; C08K 2003/222; H01L 51/5259; H01L 51/5246; H01L 51/56; H01L 2251/301; H01L 2251/5369; H01L 51/0001
See application file for complete search history.

(56) References Cited

U.S. PATENT DOCUMENTS

| | | |
|---|---|---|
| 2011/0242792 A1 | 10/2011 | Choi |
| 2014/0070140 A1* | 3/2014 | Macchi .................. C08K 3/34 252/194 |
| 2015/0060836 A1* | 3/2015 | Shim ................... H01L 51/5246 257/40 |
| 2016/0013440 A1 | 1/2016 | Luo et al. |
| 2016/0167584 A1 | 6/2016 | Chan et al. |
| 2016/0248040 A1 | 8/2016 | Liu et al. |

FOREIGN PATENT DOCUMENTS

| | | |
|---|---|---|
| CN | 104241547 A | 12/2014 |
| CN | 104362243 A | 2/2015 |
| CN | 105206760 A | 12/2015 |
| CN | 106154670 A | 11/2016 |
| CN | 205900597 U | 1/2017 |
| EP | 1357858 A1 | 11/2003 |
| EP | 2958159 A1 | 12/2015 |

OTHER PUBLICATIONS

First Chinese Office Action dated Dec. 29, 2018, received for corresponding Chinese Application No. 201710983868.1.

* cited by examiner

ENCAPSULATION STRUCTURE, PRODUCTION METHOD THEREOF, GLUE-SPREADING DEVICE, AND ENCAPSULATION GLUE

CROSS REFERENCE TO RELATED APPLICATION

This application claims the priority of Chinese Patent Application No. 201710983868.1 filed on Oct. 20, 2017, which is incorporated herein in its entirety by reference.

TECHNICAL FIELD

This disclosure relates to the field of display, in particular, to an encapsulation structure, a production method thereof, a glue-spreading device and an encapsulation glue.

BACKGROUND

During encapsulation of a display device using an encapsulation glue, a desiccant may be added into the encapsulation structure, to absorb the permeated moisture, so as to protect the encapsulated device.

Currently, it is still needed to improve the encapsulation glue and encapsulation structure comprising a desiccant.

SUMMARY

In an aspect, this disclosure provides an encapsulation structure, comprising an encapsulation glue layer, wherein the encapsulation glue layer comprises an adhesive layer formed from an adhesive glue and a desiccant composition core formed from a colloidal desiccant composition, wherein the adhesive layer fully envelops the desiccant composition core, wherein the colloidal desiccant composition comprises a colloidal desiccant-dispersing medium and a desiccant dispersed in the colloidal desiccant-dispersing medium.

Optionally, the encapsulation glue layer is a dam glue layer; and the encapsulation structure further comprises a fill glue layer filled in the region surrounded by the dam glue layer, where the fill glue layer is formed from a fill glue.

Optionally, the viscosity of the adhesive glue is larger than the viscosity of the fill glue.

Optionally, the desiccant comprises a metal or a metal oxide.

Optionally, the desiccant is selected from the group consisting of calcium, magnesium, barium, and oxides thereof.

Optionally, the desiccant has a particle size between 10 nm and 1000 nm.

Optionally, the colloidal desiccant-dispersing medium in the colloidal desiccant composition has a viscosity of 5000 to 100000 mPa·s; the adhesive glue has a viscosity of 100000 to 400000 mPa·s.

Optionally, the adhesive glue is selected from the group consisting of an acrylic resin, an epoxy resin, a melamine formaldehyde resin, an unsaturated polyester resin, a silicone resin and a furan resin.

Optionally, the adhesive glue comprises a homopolymer or copolymer of a monomer selected from the group consisting of epoxy propyl acrylate, epoxy propyl methacrylate, methyl methacrylate, ethyl methacrylate, n-butyl methacrylate, 6-7-epoxyheptyl methacrylate, and 2-hydroxyethyl methacrylate.

Optionally, the colloidal desiccant-dispersing medium comprises an epoxy resin, a copolymer containing a vinyl alcohol monomer or a copolymer containing an allyl alcohol monomer.

In another aspect, this disclosure provides a method for producing the encapsulation structure mentioned above, comprising:

co-extruding the adhesive glue and the colloidal desiccant composition, to allow the adhesive glue to fully envelop the colloidal desiccant composition; and curing the adhesive glue and the colloidal desiccant composition, to form the encapsulation glue layer.

In still another aspect, this disclosure provides a glue-spreading device for producing the encapsulation structure mentioned above, comprising:

a glue head;

a colloidal desiccant composition pipe and an adhesive glue pipe;

the glue head comprises a first channel and a second channel, wherein the first channel is in the second channel, the colloidal desiccant composition pipe is connected with the first channel, and the adhesive glue pipe is connected with the ring space formed between the first channel and the second channel.

Optionally, the glue-spreading device further comprises:

a first extruding device in the colloidal desiccant composition pipe and a second extruding device in the adhesive glue pipe;

wherein the first extruding device is configured to extrude a colloidal desiccant composition placed in the colloidal desiccant composition pipe, while the second extruding device is configured to extrude an adhesive glue place in the adhesive glue pipe.

Optionally, the glue-spreading device further comprises:

a mixer connected with the colloidal desiccant composition pipe, wherein the mixer is configured to mix the desiccant and the colloidal desiccant-dispersing medium to form a colloidal desiccant composition.

Optionally, the exit of the first channel sticks out from the exit of the second channel by 0.1 to 1 mm.

Optionally, the exit of the first channel and the exit of the second channel are bell mouths.

In yet another aspect, this disclosure provides an encapsulation glue, comprising:

an adhesive glue; and a colloidal desiccant composition, wherein the colloidal desiccant composition comprises a colloidal desiccant-dispersing medium and a desiccant dispersed in the colloidal desiccant-dispersing medium.

Optionally, the adhesive glue fully envelops the colloidal desiccant composition.

BRIEF DESCRIPTION OF THE DRAWINGS

In order to illustrate the examples of this disclosure or technical solutions in the related art, the drawings needed to describe the examples or the related art are introduced below briefly. Obviously, the drawings described below are only some examples of this disclosure. Those skilled in the art may obtain other drawings according to these drawings without paying inventive labor.

DETAILED DESCRIPTION

Figure 1:
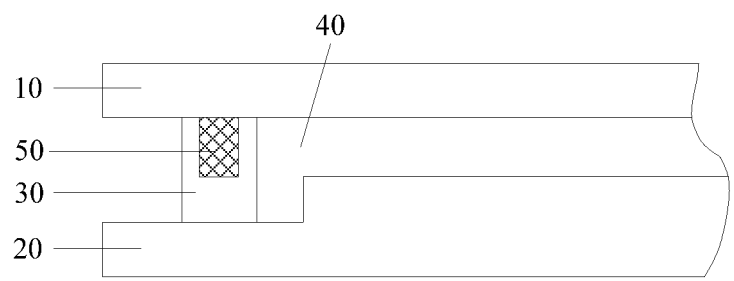
FIG. 1(a) is a schematic structural drawing showing a location of the desiccant in the encapsulation by using a dam glue and a fill glue provided in the related art.
FIG. 1(b) is a schematic structural drawing showing another location of the desiccant in the encapsulation by using a dam glue and a fill glue provided in the related art.
FIG. 1(c) is a schematic structural drawing showing still another location of the desiccant in the encapsulation by using a dam glue and a fill glue provided in the related art.
Figure 1:
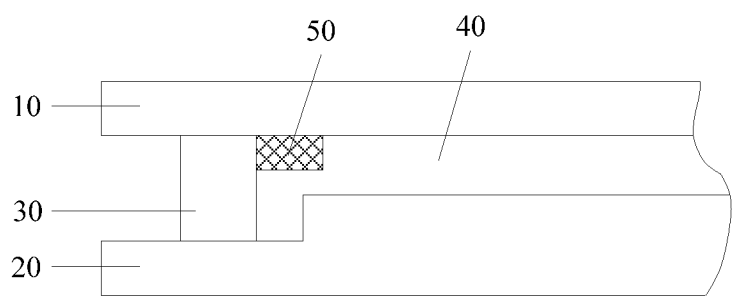
Figure 1:
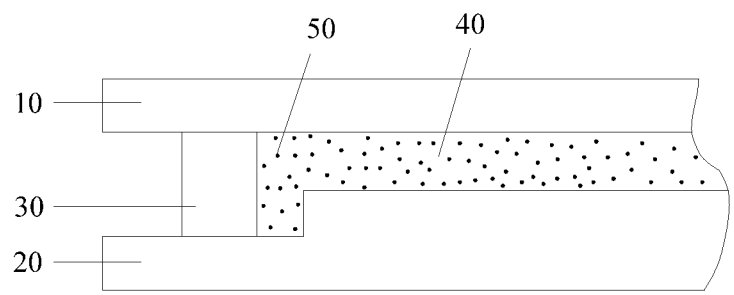

The technical solutions in examples of this disclosure will be described clearly and fully below by referring to the drawings in examples of this disclosure. Obviously, the examples described only a part of examples of this disclosure, but not all examples. On the basis of the examples in this disclosure, all other examples obtained by a person skilled in the art without inventive labor belong to the protection scope of this disclosure.

Currently, generally used encapsulation methods for OLEDs include sealant encapsulation, frit encapsulation, dam glue and fill glue encapsulation (i.e. Dam & Fill encapsulation), and the like. Among them, the Dam & Fill encapsulation method is as shown in detail in FIG. 1(a). A round of dam glue 30 is applied at the periphery of the cover plate 10. Then the fill glue 40 is applied in the region surrounded by the dam glue 30. After the cover plate and the substrate are pressed together, the fill glue 40 is fully applied on the OLED region, so that the purpose of encapsulation is achieved.

In order to improve the encapsulation effect, a desiccant is typically added into the Dam & Fill structure, to adsorb the moisture entered the glue material, so as to achieve the purpose of extending the life time of the device. However, the position where the desiccant is placed currently results in some side effects. As shown in FIG. 1(a), if the desiccant 50 is provided on the dam glue 30, since the desiccant 50 and the dam glue 30 are prepared separately, the desiccant 50 takes up bonding space of the dam glue 30 to the cover plate 10, reducing the adhesion. Therefore, peeling off between the cover plate 10 and the substrate 20 tends to occur at the periphery. As shown in FIG. 1(b), if the desiccant 50 is provided in the region surrounded by the dam glue 30, since the transparency of the desiccant 50 is relatively poor, the range of the non-display region will be enlarged. This is adverse to achieve a narrow frame. As shown in FIG. 1(c), if the desiccant 50 is dispersed in the fill glue 40, it tends to result in impurity particles at the surface of the OLED device. Further, the desiccant 50 will release heat after absorbing moisture and oxygen. Additionally, the material of the desiccant 50 is generally an alkaline metal or an oxide thereof, which would corrode the top electrode of the OLED.

Figure 2:
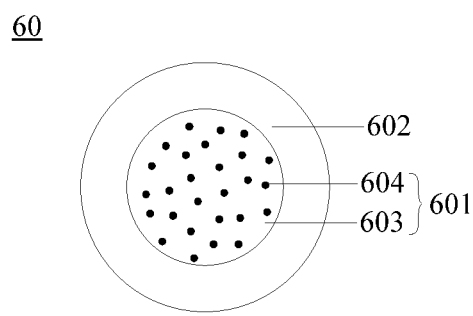
FIG. 2 is a schematic drawing of an encapsulation glue layer provided in an example of this disclosure.

An example of this disclosure provides an encapsulation structure, which comprises an encapsulation glue layer 60, as shown in FIG. 2. The encapsulation glue layer comprises a desiccant composition core 601 and an adhesive glue layer 602. The desiccant composition core 601 is formed from a colloidal desiccant composition, which comprises a colloidal desiccant-dispersing medium 603 and a desiccant 604 dispersed in the colloidal desiccant-dispersing medium 603.

It should be noticed that in the present disclosure, when a structure is described, a cured layer and an uncured layer are not distinguished by specific indications, for the purpose of being brief and clear. For example, an adhesive glue layer 602 is formed from the adhesive glue. The adhesive glue layer may refer to a layer 602 formed by applying an uncured adhesive glue, or may also refer to a layer 602 formed after the adhesive glue is cured. They are indicated by the same numeral in the drawings. And sometimes, the adhesive glue is also indicated by the numeral 602.

It should be noticed that first, the encapsulation glue 60 comprises the colloidal desiccant composition 601 and the adhesive glue 602 enveloping the colloidal desiccant composition 601. During encapsulation by the encapsulation glue 60, the encapsulation depends mainly on the adhesive glue 602, while the main effect of the colloidal desiccant-dispersing medium 603 in the colloidal desiccant composition 601 is to disperse the desiccant 604. Therefore, the adhesive property of the adhesive glue 602 is preferably greater than the adhesive property of the colloidal desiccant-dispersing medium 603 in the colloidal desiccant composition 601. Additionally, the viscosity of the adhesive glue 602 is correspondingly preferably greater than the viscosity of the colloidal desiccant-dispersing medium 603 in the colloidal desiccant composition 601. Preferably, in an example of this disclosure, the viscosity of the colloidal desiccant-dispersing medium 603 in the colloidal desiccant composition 601 is 5000 to 100000 mPa·s, and the viscosity of the adhesive glue 602 is 100000 to 400000 mPa·s.

Second, the component of the colloidal desiccant-dispersing medium 603 in the colloidal desiccant composition 601 may be, for example, a cream-like product or a glue-like product formed by a copolymer containing vinyl alcohol, a copolymer containing allyl alcohol, or the like. The component of the adhesive glue 602 may be, for example, an acrylic resin, an epoxy resin, a melamine formaldehyde resin, an unsaturated polyester resin, a silicone resin, a furan resin, or the like. It may also be a homopolymer or copolymer of a monomer selected from the group consisting of epoxy propyl acrylate, epoxy propyl methacrylate, methyl methacrylate, ethyl methacrylate, n-butyl methacrylate, 6-7-epoxyheptyl methacrylate, and 2-hydroxyethyl methacrylate.

Third, the material of the desiccant 604 in the colloidal desiccant composition 601 is not limited. For example, it may be at least one of metals or metal oxides. In particular, it may be a metal, such as Ca (calcium), Mg (magnesium), Ba (barium), or the like, or an oxide thereof.

Additionally, the particle size of the desiccant 604 dispersed in the colloidal desiccant-dispersing medium 603 is not limited. Preferably, the particle size of the desiccant 604 is between 10 nm and 1000 nm.

Fourth, the encapsulation glue 60 may be applied at the periphery of the substrate to be encapsulated, or may be applied on the whole surface of the substrate to be encapsulated. This is not limited. A suitable application may be performed according to practical requirements.

Optionally, an example of this disclosure provides an above-mentioned encapsulation structure, wherein the encapsulation glue layer is a dam glue layer, and the encapsulation structure further comprises a fill glue layer in the region surrounded by the dam glue layer, wherein the fill glue layer is formed from a fill glue. The colloidal desiccant composition 601 in the encapsulation glue 60 comprises the desiccant 604. Therefore, the desiccant 604 may adsorb the moisture entered the encapsulation glue 60. Additionally, since the colloidal desiccant composition 601 is enveloped by the adhesive glue 602 in the example of this disclosure, the adhesive glue 602 may sufficiently become into contact with the substrate to be encapsulated during the encapsulation by the encapsulation glue 60, so as to perform the encapsulation. When the encapsulation glue 60 is applied at the periphery of the cover plate 10 to serve as a dam glue 30, since the desiccant 604 is enveloped by the adhesive glue 602, it will not take up bonding space of the dam glue 30 to the cover plate 10. As compared with the related art, the problem that peeling off between the cover plate 10 and the substrate 20 tends to occur at the periphery, which is caused by the reduced bonding property between the dam glue 30 and the cover plate 10 due to that the desiccant 604 is provided on the dam glue 30, will be avoided in the example. Further, the desiccant 604 is formed in the dam glue 30 (the encapsulation glue 60 being applied at the periphery of the cover plate 10 to serve as the dam glue 30). As compared with providing the desiccant 604 in the region surrounded by the dam glue 30, the non-display region will not be enlarged in the example, which is beneficial to achieve a narrow frame. Additionally, the desiccant 604 is formed in the dam glue 30. As compared with dispersing the desiccant 604 in the fill glue 40, the property of the OLED device will not be affected in the example.

Herein, the material of the fill glue 40 is not limited. For example, it may be an acrylic resin, an epoxy resin, a melamine formaldehyde resin, an unsaturated polyester resin, a silicone resin, a furan resin, or the like, or may also be a homopolymer or copolymer of a monomer selected from the group consisting of epoxy propyl acrylate, epoxy propyl methacrylate, methyl methacrylate, ethyl methacrylate, n-butyl methacrylate, 6-7-epoxyheptyl methacrylate, and 2-hydroxyethyl methacrylate. Furthermore, the component of the fill glue 40 and the component of the adhesive glue 602 in the encapsulation glue 60 may be the same or different. On the basis of this, the fill glue 40 and the encapsulation glue 60 in an example of this disclosure is preferably a UV curing resin glue or a thermal curing resin glue.

On the basis of this, the thickness of the applied encapsulation glue 60 is not limited. Preferably, the thickness of the applied encapsulation glue 60 is 10 µm to 100 µm. Since the fill glue 40 is filled in the region surrounded by the encapsulation glue 60 and generally there are devices to be encapsulated on the substrate in this region, the thickness of the applied fill glue 40 may be smaller than the applied encapsulation glue 60.

Further, the material of the cover plate 10 is not limited. It may be, for example, glass, quartz, metal, or the like.

Figure 3:
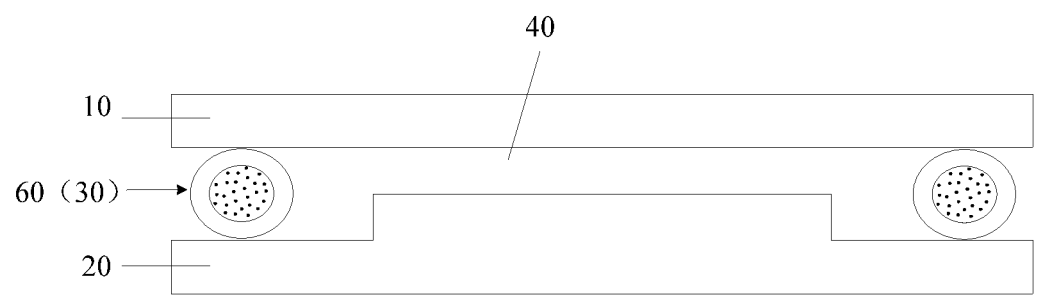
FIG. 3 is a schematic structural drawing of an encapsulation structure provided in an example of this disclosure.
Figure 4:
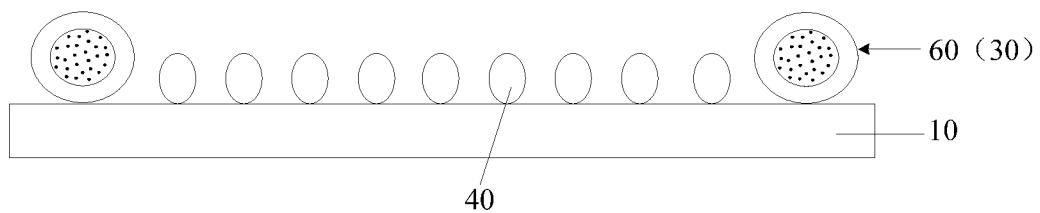
FIG. 4 is a schematic structural drawing of applying an encapsulation glue and a fill glue on a cover plate provided in an example of this disclosure.

It should be noticed that the encapsulation structure may be used to encapsulate any substrate 20. Herein, the substrate 20 may be an OLED substrate. When the substrate 20 is an OLED substrate, the substrate 20 comprises a base substrate and the anode, light-emitting functional layers and the cathode provided on the base substrate. The material of the base substrate may be glass, plastic, metal, or the like. When the encapsulation structure is used to encapsulate the substrate 20, as specifically shown in FIG. 4, first a round of the above-mentioned encapsulation glue 60 is applied at the periphery of the cover plate 10, and then the fill glue 40 is filled in the region surrounded by the encapsulation glue 60. Thereafter, as shown in FIG. 3, the substrate 20 and the cover plate 10 having the encapsulation glue 60 and the fill glue 40 applied thereon are pressed together. At last, the encapsulation glue 60 and the fill glue 40 are cured, to finish the encapsulation.

Specifically, an example of this disclosure provides an encapsulation structure. The encapsulation glue layer 60 in the encapsulation structure, i.e. the dam glue layer 30, comprises a desiccant composition core 601 and an adhesive glue layer 602 enveloping the desiccant composition core 601. The desiccant composition core 601 is formed by curing a colloidal desiccant composition. The colloidal desiccant composition comprises a colloidal desiccant-dispersing medium 603 and a desiccant 604 dispersed in the colloidal desiccant-dispersing medium 603. Since the desiccant 604 is enveloped by the adhesive glue layer 602, it will not take up bonding space of the dam glue 30 to the cover plate 10. As compared with the related art, the problem that peeling off between the cover plate 10 and the substrate 20 tends to occur at the periphery, which is caused by the reduced bonding property between the dam glue 30 and the cover plate 10 due to that the desiccant 604 is provided on the dam glue 30, will be avoided in the example. Further, the desiccant 604 is formed in the dam glue 30 (the encapsulation glue 60 being applied at the periphery of the cover plate 10 to serve as the dam glue 30). As compared with providing the desiccant 604 in the region surrounded by the dam glue 30, the non-display region will not be enlarged in the example, which is beneficial to achieve a narrow frame. Further, the desiccant 604 is near the edge of the cover plate 10 and can absorb the moisture and oxygen in time once they have entered the dam glue 30, so as to prevent the further entrance of the moisture and oxygen into the substrate 20, to improve the bonding property of the encapsulation glue 60 and the fill glue 40 to the cover plate 10 and the encapsulation property. Additionally, the desiccant 604 is formed in the dam glue 30. As compared with dispersing the desiccant 604 in the fill glue 40, the property of the OLED device will not be affected in the example.

On the basis of above, the viscosity of the encapsulation glue 60 is preferably larger than the viscosity of the fill glue 40 in an example of this disclosure, since the main function of the dam glue layer 30 (encapsulation glue 60 being applied at the periphery of the cover plate 10, wherein the encapsulation glue layer 60 corresponds to the dam glue layer 30) is sealing effect and to bond the cover plate 10 and the substrate 20 together, while the main function of the fill glue 40 is to maintain the thickness of the cell.

On the basis of above, it is preferred in an example of this disclosure that the viscosity of the colloidal desiccant-dispersing medium in the adhesive glue 602 in the encapsulation glue 60 is 100000 to 400000 mPa·s, and the viscosity of the fill glue 40 is 100 to 2000 mPa·s.

An example of this disclosure provides a method for producing the encapsulation structure mentioned above, comprising:

co-extruding the adhesive glue and the colloidal desiccant composition, to allow the adhesive glue fully enveloping the colloidal desiccant composition; and curing the adhesive glue and the colloidal desiccant composition, to form the encapsulation glue layer.

The structure in which the adhesive glue fully envelops colloidal desiccant composition may be formed conveniently by a co-extruding method.

After the encapsulation glue is applied by extrusion, the encapsulation glue may be cured by means of UV curing, thermal curing or the like, to form the encapsulation glue layer. If the encapsulation glue layer is a dam layer and a fill glue is also applied, the fill glue may be also cured by means of UV curing, thermal curing or the like.

Of course, as shown in FIG. 2, it is also possible to form the encapsulation glue as a glue layer structure in which the adhesive glue has enveloped the colloidal desiccant composition and then apply the encapsulation glue directly. However, in this case, the adhesive glue for envelopment must have a sufficient thickness and a certain strength, so as to avoid the exposure of the enveloped colloidal desiccant composition during the application.

Figure 5:
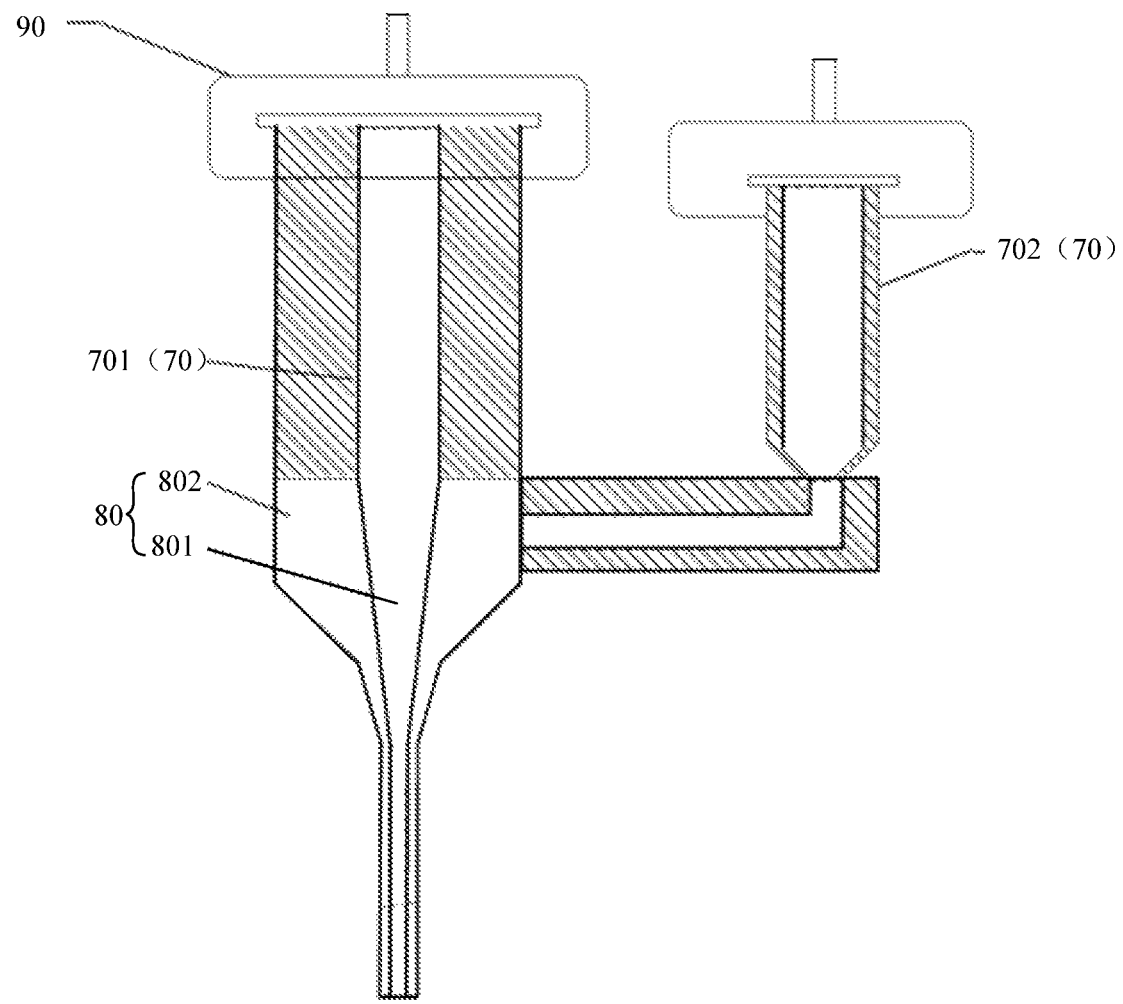
FIG. 5 is a schematic sectional structural drawing of a glue-spreading device provided in an example of this disclosure.

As shown in FIG. 5, an example of this disclosure provides a glue-spreading device, comprising: a glue pipe 70 and a glue head 80 being connected with the glue pipe 70. The glue pipe 70 comprises a colloidal desiccant composition pipe 701 and an adhesive glue pipe 702. The glue head 80 comprises a first channel 801 and a second channel 802. The first channel 801 is provided in the second channel 802. The colloidal desiccant composition pipe 701 is connected with the first channel 801, and the adhesive glue pipe 702 is connected with the ring space formed between the first channel 801 and the second channel 802.

It should be noticed that since the colloidal desiccant composition pipe 701 is connected with the first channel 801, the colloidal desiccant-dispersing medium placed in the colloidal desiccant composition pipe 701 may be extruded through the first channel 801; and since the adhesive glue pipe 702 is connected with the ring space formed between the first channel 801 and the second channel 802, the adhesive glue placed in the adhesive glue pipe 702 may be extruded through the ring space formed between the first channel 801 and the second channel 802. Since the first channel 801 is provided in the second channel 802, when the colloidal desiccant-dispersing medium in the colloidal desiccant composition pipe 701 and the adhesive glue in the adhesive glue pipe 702 are pressed synchronously, the colloidal desiccant-dispersing medium extruded through the first channel 801 is enveloped by the adhesive glue extruded through the ring space formed between the first channel 801 and second channel 802, so as to form a cored glue material.

Herein, the component of the colloidal desiccant-dispersing medium placed in the colloidal desiccant composition pipe 701 and the component of the adhesive glue placed in the adhesive glue pipe 702 are not limited. The component of the colloidal desiccant-dispersing medium placed in the colloidal desiccant composition pipe 701 and the component of the adhesive glue placed in the adhesive glue pipe 702 may be the same or different. When the component of the colloidal desiccant-dispersing medium placed in the colloidal desiccant composition pipe 701 and the component of the adhesive glue placed in the adhesive glue pipe 702 are different, if the colloidal desiccant composition is placed in the colloidal desiccant composition pipe 701 and the adhesive glue is placed in the adhesive glue pipe 702, the encapsulation glue extruded from the glue-spreading device is a cored structure, in which the adhesive glue envelops the colloidal desiccant composition.

On the basis of above, when the materials for forming the colloidal desiccant composition 601 in the encapsulation glue 60, i.e. the colloidal desiccant-dispersing medium 603 and the desiccant 604 dispersed in the colloidal desiccant-dispersing medium 603, are placed in the colloidal desiccant composition pipe 701 and the material for forming the adhesive glue 602 in the encapsulation glue 60 is placed in the adhesive glue pipe 702, the product applied by the glue-spreading device is the above-mentioned encapsulation glue 60, in which the adhesive glue 602 envelops the colloidal desiccant composition 601, wherein the colloidal desiccant composition 601 comprises the colloidal desiccant-dispersing medium 603 and the desiccant 604 dispersed in the colloidal desiccant-dispersing medium 603. In order to disperse the desiccant into the colloidal desiccant-dispersing medium uniformly, a mixer connected with the colloidal desiccant composition pipe may also be provided. The mixer is configured to mix the desiccant and the colloidal desiccant-dispersing medium to form the colloidal desiccant composition.

Herein, the glue-spreading device may comprise a fixing device 90, as shown in FIG. 5, in addition to the glue pipe 70 and the glue head 80.

An example of this disclosure provides a glue-spreading device. The glue-spreading device comprises a glue pipe 70 and a glue head 80, wherein the glue pipe 70 comprises a colloidal desiccant composition pipe 701 and an adhesive glue pipe 702. The glue head 80 comprises a first channel 801 and a second channel 802. The first channel 801 is provided in the second channel 802. The colloidal desiccant composition pipe 701 is connected with the first channel 801. The adhesive glue pipe 702 is connected with the ring space formed between the first channel 801 and the second channel 802. Therefore, when the colloidal desiccant-dispersing medium placed in the colloidal desiccant composition pipe 701 and the adhesive glue placed in the adhesive glue pipe 702 are different, the encapsulation glue applied by this glue-spreading device is a cored structure.

On the basis of above, when the material for forming the colloidal desiccant composition 601 in the encapsulation glue 60 mentioned above is placed in the colloidal desiccant composition pipe 701 and the material for forming the adhesive glue 602 is placed in the adhesive glue pipe 702, the above-mentioned encapsulation glue 60 may be applied by using this glue-spreading device.

Figure 6:
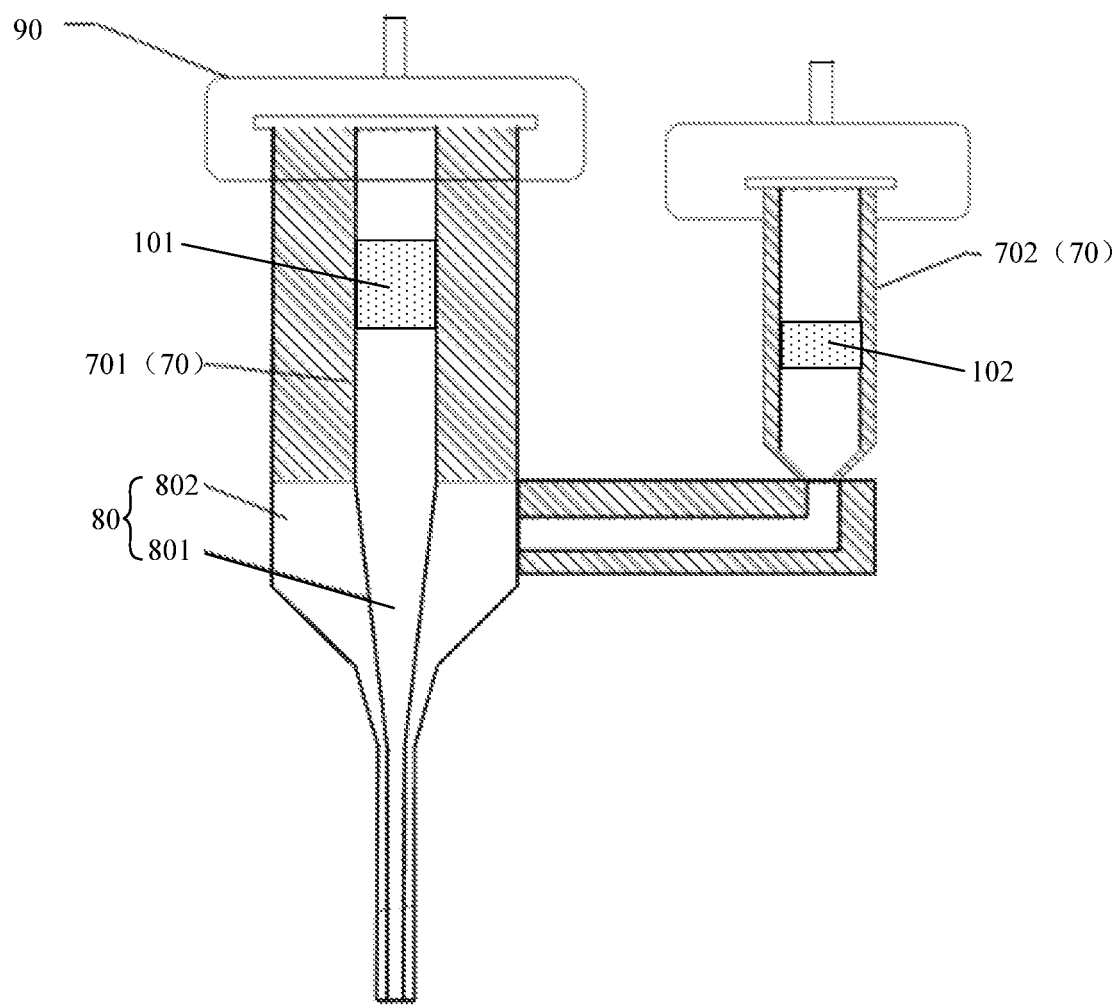
FIG. 6 is a schematic sectional structural drawing of a glue-spreading device provided in an example of this disclosure.

Preferably, as shown in FIG. 6, the glue-spreading device further comprises a first extruding device 101 provided in the colloidal desiccant composition pipe 701 and a second extruding device 102 provided in the adhesive glue pipe 702. The first extruding device 101 is used to extrude the colloidal desiccant-dispersing medium placed in the colloidal desiccant composition pipe 701, while the second extruding device 102 is used to extrude the adhesive glue placed in the adhesive glue pipe 702.

Herein, the structures of the first extruding device 101 and the second extruding device 102 are not limited, as long as the colloidal desiccant-dispersing medium placed in the colloidal desiccant composition pipe 701 and the adhesive glue placed in the adhesive glue pipe 702 may be extruded. Herein, the first extruding device 101 and the second extruding device 102 may perform extrusion in a manner of pneumatic press, or in a manner of mechanical press. Of course, it may also perform extrusion in another manner, which is not limited. The extruding device may be, for example, a piston.

In an example of this disclosure, since the glue-spreading device further comprises the first extruding device 101 and the second extruding device 102, the colloidal desiccant-dispersing medium placed in the colloidal desiccant composition pipe 701 and the adhesive glue placed in the adhesive glue pipe 702 may be extruded by the first extruding device 101 and the second extruding device 102, respectively, so that the glue-spreading device may provide the glue rapidly, and thus the efficiency of spreading glue is improved.

Since the first channel 801 is provided in the second channel 802, an embodiment of this disclosure provides the following two preferred solutions, in order to prevent the adhesive glue extruded from the second channel 802 from blocking the exit of the first channel 801.

Figure 7:
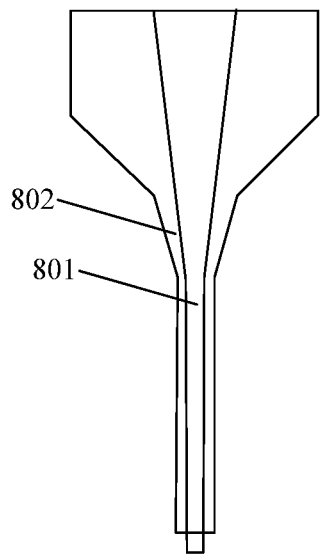
FIG. 7 is a schematic sectional structural drawing of a glue head in a glue-spreading device provided in an example of this disclosure.

Preferred solution I, as shown in FIG. 7, wherein the length of the first channel 801 is larger than the length of the second channel 802. In other words, the exit of the first channel sticks out from the second channel.

Herein, the difference between the length of the first channel 801 and the length of the second channel 802 is not limited. If the difference between the length of the first channel 801 and the length of the second channel 802 is too small, the adhesive glue extruded from the second channel 802 may still block the exit of the first channel 801. If the difference between the length of the first channel 801 and the length of the second channel 802 is too large, a cored structure may be not formed by the encapsulation glue extruded from the glue-spreading device. On the basis of above, in an example of this disclosure, the difference between the length of the first channel 801 and the length of the second channel 802 is preferably 0.1 to 1 mm.

Figure 8:
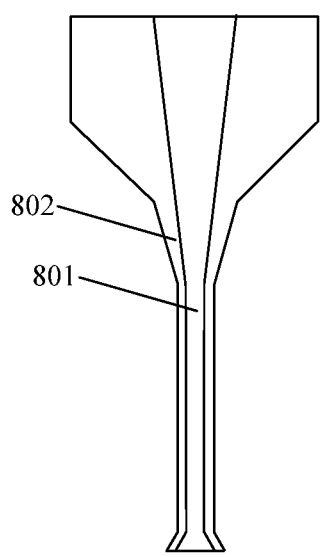
FIG. 8 is a schematic sectional structural drawing of another glue head in a glue-spreading device provided in an example of this disclosure.

Preferred solution II, as shown in FIG. 8, wherein the exit of the first channel 801 and the exit of the second channel 802 are bell mouths.

Herein, a bell mouth refers to that in the exit, the inner diameter of the end closer to the glue pipe is less than the inner diameter of the end away from the glue pipe.

Herein, when the exit of the first channel 801 and the exit of the second channel 802 are bell mouths, the sizes of the bell mouths are not limited and may be set correspondingly according to requirements.

In an example of this disclosure, when the length of the first channel 801 is larger than the length of the second channel 802, or, when the exit of the first channel 801 and the exit of the second channel 802 are bell mouths, the blocking of the exit of the first channel 801 by the adhesive glue extruded from the second channel 802 may be prevented, so that the performance of the glue-spreading device is improved.

An example of this disclosure provides an encapsulation glue, comprising: an adhesive glue; and a colloidal desiccant composition, wherein the colloidal desiccant composition comprises a colloidal desiccant-dispersing medium and a desiccant dispersed in the colloidal desiccant-dispersing medium.

The encapsulation glue of this disclosure comprises two components, i.e. the adhesive glue component, which mainly provides the function of bonding, and the colloidal desiccant composition, which mainly provides the function of moisture absorption. The two components may also be stored separately and become into contact with each other until being applied.

The encapsulation glue may also be prepared in the form of the encapsulation glue layer shown in FIG. 2, wherein the adhesive glue fully envelops colloidal desiccant composition. This encapsulation glue may be applied to a cover plate to be encapsulated by an appropriate device, while it is ensured that the enveloped colloidal desiccant composition is not exposed during the application.

In examples of this disclosure, an encapsulation glue, a encapsulation structure and a glue-spreading device are provided. They may at least partially solve the following problems in the related art, including that peeling off between the cover plate and the substrate tends to occur at the periphery due to placing the desiccant on the dam glue, that the range of the non-display region is enlarged due to placing the desiccant in the region surrounded by the dam glue, and that the property of the OLED device is affected due to dispersing the desiccant in the fill glue.

In examples of this disclosure, an encapsulation glue, a encapsulation structure and a glue-spreading device are provided. Since the first colloidal layer in the encapsulation glue comprises the desiccant, the desiccant may adsorb the moisture entered the encapsulation glue. Additionally, since the first colloidal layer is enveloped by the second colloidal layer in the example of this disclosure, the second colloidal layer may sufficiently become into contact with the substrate to be encapsulated during the encapsulation by the encapsulation glue, so as to perform the encapsulation. When the encapsulation glue is applied at the periphery of the cover plate to serve as a dam glue, since the desiccant is enveloped by the second colloidal layer, it will not take up bonding space of the dam glue to the cover plate. As compared with the related art, the problem that peeling off between the cover plate and the substrate tends to occur at the periphery, which is caused by the reduced bonding property between the dam glue and the cover plate due to that the desiccant is provided on the dam glue, will be avoided in the example. Further, the desiccant is formed in the dam glue (the encapsulation glue being applied at the periphery of the cover plate to serve as the dam glue). As compared with providing the desiccant in the region surrounded by the dam glue, the non-display region will not be enlarged in the example, which is beneficial to achieve a narrow frame. Additionally, the desiccant is formed in the dam glue. As compared with dispersing the desiccant in the fill glue, the property of the OLED device will not be affected in the example.

The above mentioned contents are only specific embodiments of this disclosure. However, the protection scope of this disclosure is not limited thereto. Any changes or replacements that may be envisaged easily by a person skilled in the art in the technical range disclosed by this disclosure should be involved in the protection scope of this disclosure. Therefore, the protection scope of this disclosure should be determined by the protection scope of the claims.

The invention claimed is:

1. An encapsulation structure in a display device comprising a cover plate and a substrate, wherein the encapsulation structure comprises an encapsulation glue layer between the cover plate and the substrate, wherein the encapsulation glue layer comprises an adhesive layer formed from an adhesive glue and a desiccant composition core formed from a colloidal desiccant composition, wherein the adhesive layer fully envelops the desiccant composition core, wherein the colloidal desiccant composition comprises a colloidal desiccant-dispersing medium and a desiccant dispersed in the colloidal desiccant-dispersing medium, wherein the adhesive layer is in direct contact with both of the cover plate and the substrate, and wherein the desiccant composition core and the cover plate are entirely separated by the adhesive layer, and the desiccant composition core and the substrate are entirely separated by the adhesive layer.

2. The encapsulation structure according to claim 1, wherein the encapsulation glue layer is a dam glue layer; and the encapsulation structure further comprises a fill glue layer filled in a region surrounded by the dam glue layer, where the fill glue layer is formed from a fill glue.

3. The encapsulation structure according to claim 2, wherein a viscosity of the adhesive glue is larger than a viscosity of the fill glue.

4. The encapsulation structure according to claim 1, wherein the desiccant comprises a metal or a metal oxide.

5. The encapsulation structure according to claim 4, wherein the desiccant is selected from the group consisting of calcium, magnesium, barium, and oxides thereof.

6. The encapsulation structure according to claim 1, wherein the desiccant has a particle size between 10 nm and 1000 nm.

7. The encapsulation structure according to claim 1, wherein the colloidal desiccant-dispersing medium in the colloidal desiccant composition has a viscosity of 5000 to 100000 mPa·s, and the adhesive glue has a viscosity of 100000 to 400000 mPa·s.

8. The encapsulation structure according to claim 1, wherein the adhesive glue is selected from the group consisting of an acrylic resin, an epoxy resin, a melamine formaldehyde resin, an unsaturated polyester resin, a silicone resin and a furan resin.

9. The encapsulation structure according to claim 1, wherein the adhesive glue comprises a homopolymer or copolymer of a monomer selected from the group consisting of epoxy propyl acrylate, epoxy propyl methacrylate, methyl methacrylate, ethyl methacrylate, n-butyl methacrylate, 6-7-epoxyheptyl methacrylate, and 2-hydroxyethyl methacrylate.

10. The encapsulation structure according to claim 1, wherein the colloidal desiccant-dispersing medium comprises an epoxy resin, a copolymer containing a vinyl alcohol monomer or a copolymer containing an allyl alcohol monomer.

* * * * *